US 6,628,358 B1

(12) United States Patent
Colson

(10) Patent No.: US 6,628,358 B1
(45) Date of Patent: Sep. 30, 2003

(54) METHOD FOR PROCESSING CONDUCTIVE LAYER STRUCTURES AND DEVICES INCLUDING SUCH CONDUCTIVE LAYER STRUCTURES

(75) Inventor: Paul Frans Marie Colson, Aalter (BE)

(73) Assignee: Alcatel, Paris (FR)

( * ) Notice: Subject to any disclaimer, the term of this patent is extended or adjusted under 35 U.S.C. 154(b) by 166 days.

(21) Appl. No.: 09/652,788

(22) Filed: Aug. 31, 2000

(30) Foreign Application Priority Data

Sep. 3, 1999 (EP) ............................................ 99402187

(51) Int. Cl.⁷ ...................... G02F 1/1362; G02F 1/1335
(52) U.S. Cl. ........................ 349/114; 349/113; 349/43; 349/143
(58) Field of Search ................................ 349/113, 114, 349/143, 144, 147, 43

(56) References Cited

U.S. PATENT DOCUMENTS

| 4,820,611 | A | * | 4/1989 | Arnold, III et al. ......... 430/271 |
| 5,022,726 | A | * | 6/1991 | Austin et al. ................ 350/1.7 |
| 5,427,666 | A | * | 6/1995 | Mueller et al. ......... 204/192.17 |
| 5,706,067 | A | | 1/1998 | Colgan et al. |
| 5,747,830 | A | * | 5/1998 | Okita .......................... 257/72 |
| 5,892,563 | A | * | 4/1999 | Ono et al. ................... 349/143 |
| 6,049,132 | A | * | 4/2000 | Iwashashi et al. ........... 257/763 |
| 6,233,034 | B1 | * | 5/2001 | Lee et al. .................... 349/141 |
| 6,292,246 | B1 | * | 9/2001 | Shinohara et al. .......... 349/143 |

FOREIGN PATENT DOCUMENTS

GB    2 228 128 A    8/1990
JP    05 241 199 A1  9/1993

* cited by examiner

Primary Examiner—Robert H. Kim
Assistant Examiner—Hoan Nguyen
(74) Attorney, Agent, or Firm—Sughrue Mion, PLLC

(57) ABSTRACT

In a method for processing conductive layer structures in a four metal layer CMOS process, the step of depositing the third conductive layer (30) includes at least one succession of depositions of a light-absorbing layer (301;303) on top of a light-reflective layer (300;302), such that the total thickness of said third conductive layer (30) does not exceed 350 nm. Devices including these conductive layer structures, such as reflective type liquid crystal display devices as well as metal capacitor structures which are processed using the subject method are as well described.

19 Claims, 2 Drawing Sheets

METHOD FOR PROCESSING CONDUCTIVE LAYER STRUCTURES AND DEVICES INCLUDING SUCH CONDUCTIVE LAYER STRUCTURES

BACKGROUND OF THE INVENTION

The present invention relates to a method for processing conductive layer structures, and to devices including such a conductive layer structures such as reflective type liquid crystal display devices, and metal capacitors.

Such a method for processing, for instance used for processing a reflective type liquid crystal display device including four metal levels, is already known in the art, e.g. from U.S. Pat. No. 5,892,563 "Reflective Type Liquid Crystal Display Device". Therein, in FIG. 1 a reflective type liquid crystal display device is shown including four r layers, of which the top metal layer serves as the pixel electrode layer, of which the lowest two layers serve as row and column electrodes, and or of which the third metal layer serves as a light shield for preventing incident light to disturb the operation of active circuitry within the substrate.

As is mentioned within this prior art document, the material used for the light shield is the traditional metal layer used in most CMOS processes, namely Aluminium.

Aluminium layers are traditionally deposited to thicknesses of typically 400 nm or more using standard CMOS processing steps. Since however the pixel electrode top layer has to be driven and consequently to make contact with the underlying second conductive layer, the presence of an intermediate thick metal-3 layer seriously increases the processing complexity for making such a contact.

The same is true in other conductive layer structures such as metal capacitors whereby the capacitance value of a metal2-metal3 capacitor is increased by parallel connecting it with a second metal-3-metal4 capacitor. In this case the metal4 top plate has to make contact with the metal2 bottom plate, whereas the intermediate metal3 plate serves as a common plate. The formation of such a deep contact between metal4 and metal2, in the presence of a thick metal-3 layer such as Aluminium, is difficult.

Straightforward using a thinner Aluminium layer does not present a solution to this problem since, as is also well known in the art, thinner Aluminium layers have problems with voids, such that their functioning as a light shield is hampered.

Another problem with Aluminium is that it is a light reflective layer. In reflective type liquid crystal display devices where the third conductive layer is used as a light shield, the incident light is thereby reflected multiple times in between the metal3 and metal4 layers. However this multiple reflected light can still penetrate the underlying silicon via some holes present in the light shield, e.g. for enabling the aforementioned contact between the fourth and the second conductive layers to be made.

SUMMARY OF THE INVENTION

An object of the present invention is therefore to provide a method for processing conductive layer structures of the above known type, as well as these conductive layer structures such as a reflective type liquid crystal display device and a metal capacitor, but wherein the aforementioned problems of topography, voiding and light reflection are solved.

According to the invention, this object is achieved by a method of processing conductive layer structures, including the steps of depositing a first conductive layer, a first intermetal insulator layer; a second conductive layer, a second intermetal insulator layer, a third conductive layer, a third intermetal insulator layer, and a fourth conductive layer, wherein the step of depositing the third conductive layer includes at least one succession of depositions of a light-absorbing layer on top of a light-reflective layer, such that the total thickness of said third conductive layer does not exceed 350 nm.

The object of the invention is further achieved by a reflective type liquid crystal display device (RTLCDD) including an array of reflective pixel electrodes over a surface of a silicon substrate with light transmissive regions located between the reflective pixel electrodes, structures defined in a first conductive layer between the reflective pixel electrodes and the surface, structures defined in a second conductive layer between the reflective pixel electrodes and the surface, and light shield structures defined in a third conductive layer between the reflective pixel electrodes and the surface, for preventing light entering at active circuitry located within the silicon substrate, the reflective pixel electrodes being formed in a fourth conductive layer, wherein the third conductive layer is composed of at least one multilayer comprising a light absorbing material on top of a light reflective material, such that the total thickness of said third conductive layer does not exceed 350 nanometers.

The object of the invention is still further achieved by a metal capacitor structure formed in a four-metal layer CMOS process wherein a first, a second, a third, and a fourth conductive layer are present, in between which a first, a second and a third intermetal insulator layer are present, the metal capacitor structure including a parallel connection of a first capacitor formed between the second conductive layer of the CMOS process and the third conductive layer of the CMOS process, and a second capacitor formed between the third conductive layer and the fourth conductive layer of the CMOS process, wherein the third conductive layer is composed of at least one multilayer comprising a light absorbing material on top of a light reflective material, such that the total thickness of the third conductive layer does not exceed 350 nanometers.

In this way, the presence of at least one multilayer consisting of a sandwich of a light absorbing material on top of a light reflective material, such that the total thickness of the third conductive layer does not exceed 350 nm, solves the aforementioned problems. Indeed, reducing the thickness with 12.5%, or more, results in less topography problems, whereas the presence of the absorbing layer on top of a reflective layer alleviates the problem of multiple reflections due to the extra absorption in the absorbing layer. Moreover, such a multilayer reduces the voiding.

Another characteristic feature of the present invention is that the light-absorbing layer comprises Titanium Nitride (TiN), on top of the light reflective layer which comprises Titanium (Ti).

Both materials are standard materials used in CMOS processing, and can be made very thin. As will become clear from the descriptive part of this document, a thickness of 60 nm of TiN on top of 20 nm of Ti can be used for this multilayer. In a particular embodiment of a reflective type liquid crystal display, this multilayer is repeated twice resulting in a total thickness of 160 nm for the third conductive layer which is sufficient for providing an effective shield for an envisaged application of shielding light with an energy of 1 Mlux. Depending on the envisaged applications which relate to the incident light in the structure, even thinner layers can be used. In the case of the metal capacitor structure, a single multilayer consisting of 60 nm TiN on top of 20 nm Ti can even be used. This presents a reduction in thickness of more than 80% with respect to the Aluminium layer.

Another characteristic feature of the invention is that the fourth conductive layer is composed of a light reflective layer on top of a light absorbing layer, and/or wherein the third intermetal insulator layer is further planarized to a thickness of maximum 365 nm above the third conductive layer, and/or where the fourth conductive layer has a thickness smaller than the dimensions of the light transmissive regions between the pixel electrodes, e.g., smaller than 500 nm, with the fourth conductive layer composed of a light reflective layer on top of a light absorbing layer.

This is especially important for the liquid crystal display devices whereby the problem of multiple reflections between the light shield and the pixel electrode layer is solved even better. Indeed, if the distance between the third and fourth conductive layers does not exceed the distance between the pixel electrodes, only incident light with wavelengths larger than the light transmissive regions between the pixel electrodes can enter the structure, and these will further be multiple reflected within a kind of tunnel structure between the third and fourth metal layers. Due to the presence of the light absorbing layer at both inner sides of this tunnel created by the bottom layer of the fourth conductive layer and the top layer of the third conductive layer, this light will be finally absorbed.

By keeping the openings between the pixel electrodes as well as the openings within the light shield smaller or equal to 500 nm, all incident light with larger wavelengths is prohibited from entering the structure. Thus only a small fraction of the light can enter the structure, it will be multreflected and finally absorbed between metal3 and 4. The thickness of the third intermetal insulator layer is thereby 365 nm at maximum, corresponding to the wavelength of UV light, which is the lower limit in wavelength of the entering light in some of the envisaged applications.

Yet another characteristic feature of the present invention is the second intermnetal layer between the second conductive layer and the third conductive layer has a thickness of a maximum of 600 nm.

Thereby, by keeping the dimension of the overlap region between the pixel electrodes and the underlying light shield to be at least a factor of 10 larger than the dimensions of the light transmissive regions between the pixel electrodes, enough of these multiple reflections will occur so that the incident lightwave is completely absorbed at the end of this tunnel between the light shield and the pixel electrodes.

Further characteristic features of the present are mentioned in claims 6–7, 14–15 and 18–19.

Thereby the thickness of the second intermetal insulator layer is also kept small enough, so that the total thickness of both second and third intermetal insulator layers allows one via hole to be formed and subsequently filled with a conductive material. A very small direct contact is thereby created between metal4 and metal2 level. This allows very dense structures to be made.

BRIEF DESCRIPTION OF THE DRAWINGS

The above and other objects and features of the invention will become more apparent and the invention itself will be best understood by referring to the following description of an embodiment taken in conjunction with the accompanying drawings wherein FIG. 1 schematically shows a cross section of a reflective type liquid crystal display device RTLCDD according to the invention wherein the processing steps according to the invention are used, and FIG. 2 schematically shows a cross second of a metal capacitor structure C according to the invention wherein also processing steps according to the invention are used.

DETAILED DESCRIPTION OF THE INVENTION

The subject method for processing conductive layer structures is used in the processing of for instance reflective type liquid crystal display devices and in metal capacitors. In a first portion of the descriptive part of this document the reflective type liquid crystal display devices will be described. In a later section this will be followed by a description of the metal capacitor structures according to the invention.

Figure 1:
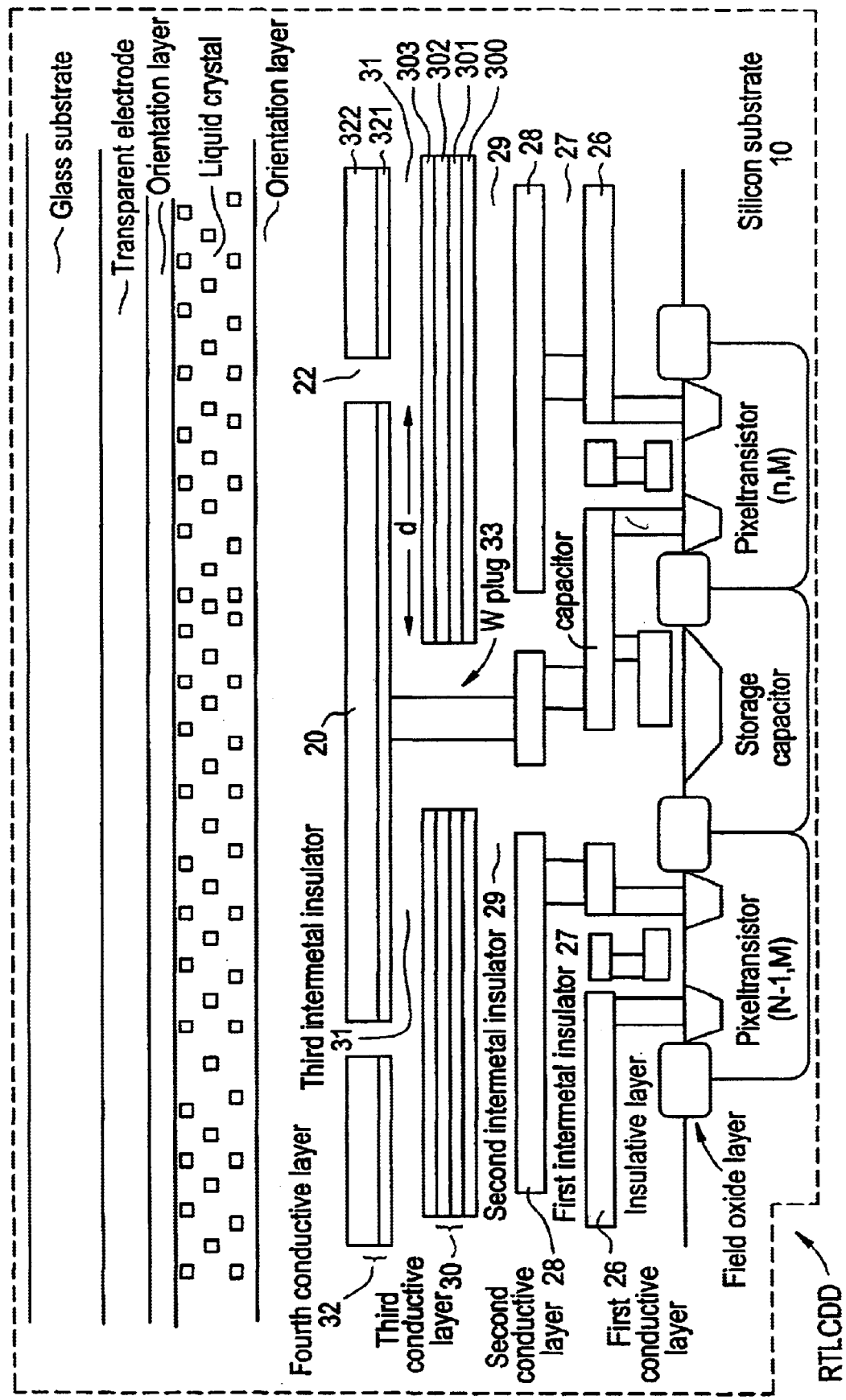
Figure 2:
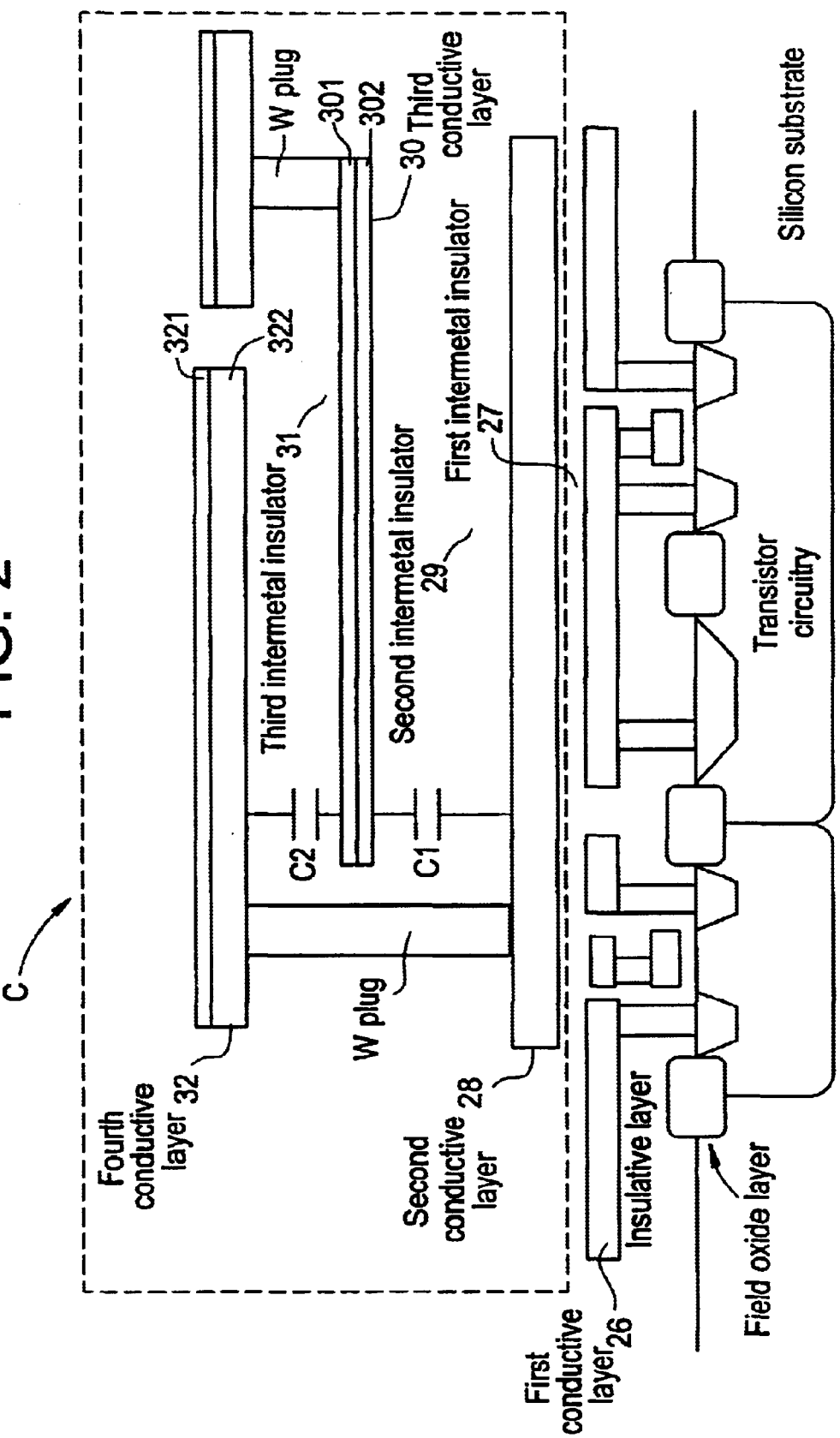

Microdisplay-based imaging systems are quickly becoming very important, whereby resolutions with 5 megapixels are currently envisaged. Amongst several alternatives for producing such microdisplays, the technology using a reflective type liquid crystal display device is becoming very attractive because of the advantage of the combination of a CMOS-like active matrix technology with a reflective type liquid crystal technology. The present invention deals with such an active matrix reflective type liquid crystal display device and with the semiconductor technology for processing it. A cross section of such a device in a simplified form is shown in cross-sectional view in the FIG. 1. It is to be remarked that this figure only represents a schematic representation including the different elements of the processed structures, which are not drawn to scale, and which will also not all be discussed into detail in this document. A person skilled in the art is however adapted to understand such cross-sections and can recognize therefrom different elements such as transistors with gate oxides, source and drain regions, wells, capacitors, polysilicon layers, contact holes, vias, field oxides, etc. which are also shown in FIGS. 1 and 2.

The basic structure of the device RTLCDD in the figure includes active matrix transistors such as pixeltransistors (N−1,M) and (N,M) which are processed using classical submicron CMOS technologies within a silicon substrate 10. Drains and sources of the pixel electrodes are contacted at the first conductive layer 26, in a typical embodiment consisting of a classically processed Aluminium layer. The metal1 lines serve as row lines for the active matrix display. On top of this first conductive layer 26 a classical intermediate oxide such as a Plasma enhanced chemical vapour deposited oxide, is deposited, after which a planarisation step is performed. This results in a first intermetal insulator layer 27. Next contact or via holes are etched within this region, and a second conductive layer 28 is deposited. This layer also may consist of a classically processed Aluminium layer. Metal-2 deposition patterning and etching, is followed by the deposition of another intermetal insulator layer 29, in one embodiment consisting of a PETEOS layer which stands for Plasma Enhanced Tetra Ethyl OrthoSilicate glass, and which is obtained by plasma enhanced chemical vapour deposition. This layer is planarized by for instance using chemical mechanical polishing, because of extreme requirements of topography for the next layers. The total thickness of the resulting layer 29 is maximum 600 nm on top of metal-2 lines, for these reasons of topography. On underlying insulator layers, the thickness of layer 29 can be higher.

This step is followed by the deposition of a third conductive layer 30. This third conductive layer, in one variant of the structure which is depicted in FIG. 1, consists of a double sandwich of TiN on top of Ti, whereby a first Ti layer 300 has a thickness of 20 nm, a first TiN layer 301 has a thickness of 60 nm, a second Ti layer 302 again has a thickness of 20 nm and a second TiN layer 303 has a thickness of again 60 nm. The final thickness of the third conductive layer 30 is thus 160 nm. However other variants are possible whereby a Ti layer of 40 nm is covered by a TiN layer of 120 nm, or even 3 sandwich layers on top of each other. What is really required is that the total thickness of the third conductive layer is maximum 350 nm, and preferrably as small as possible, for the above mentioned reasons of topography. In fact, for reflective type liquid crystal display devices, the minimum thickness is determined by the energy of the incident light which needs to be shielded. In the case of visible light with an energy of 1 Mlux, the depicted structure with a total thickness of 160 nm for layer 30 has proven to be sufficient. If the incident energy is less, thinner layers can be used.

The fact of using a multilayer with an anti-reflective or absorbing layer such as TiN on top of a reflective layer such as Ti or Al has, besides the advantage of being very thin, also other benefits which will be explained in a further section of this document.

The third conductive layer 30 serves as a light shield. However openings in this shield are to be provided to allow contacts to be made between the later deposited fourth conductive layer and the already available second conductive layer. In some embodiments of the displays according to the invention, contacting the metal4 to the metal2 can occur via two vias, a first one between metal2 and a small island of an intermediate metal-3 layer, and a second via between this intermediate metal3 layer and the final metal4 layer. In another alternative embodiment, such as depicted in FIG. 1, a direct via between the fourth and the second conductive layer, allows for more denser structures. This via is depicted as "W-plug" 33 in FIG. 1.

Etching the openings in this third conductive layer 30 is then followed by the deposition of a third intermetal insulator layer 31. This may again consist of another PETEOS layer, having a thickness as deposited of 600 nm. The advantage of using such a PETEOS layer is that is has a perfect gap filling capability. This is especially important in these regions in which the third metal layer is etched. Again chemical mechanical polishing is used to obtain a structure which is as planar as possible, in one embodiment resulting in a third intermetal insulator layer 31 having a thickness not higher than 365 nm on top of the third conductive layer 30. The planarity is extremely important for reflective type liquid crystal displays, in which the next fourth conductive layer is to be used for the pixel electrodes. As is well known these have to drive the Liquid crystals on top of it.

Since these pixel electrodes have to be driven by signals, contacts with the underlying metal-2 layer structures, preferrably via the aforementioned W plugs, are to be foreseen.

Therefore, before the deposition of the fourth conductive layer 32, first these vias are to be formed. This occurs first by patterning and etching through the combined PETEOS layers, of which the resulting thickness can be as high as 965 nm.

In a particular embodiment, this via has a diameter of 500 nm. Keeping this via as small as possible of course increases the light shield efficiency.

After the via definition and etching, the via is filled with for instance W, for the W-plug formation.

Since the fourth metal layer is the pixel electrode layer in FIG. 1, reflectivity is of prime importance. This is obtained by depositing a thin reflective layer on top of a barrier layer, for instance by first depositing an absorbing layer 321 such as TiN, with a thickness of for instance 60 nm, followed by the deposition of a reflective layer 322 such as Aluminium with a thickness of for instance 200 nm. However other thickness values and materials may be used as well. As is well known by a person skilled in the art, the reflectivity of Aluminium improves for thinner layers. As thin as possible reflective layers are thus preferred. The aforementioned problem of voiding in thin Aluminium layers is solved by the fact that there is a light absorbing barrier layer such as TiN beneath the 200 nm aluminium layer.

The openings or light transmissive regions 22 which are to be realised between the pixel electrodes are to be as small as possible. Indeed, small gaps between the pixel electrodes 20 again increase the light shielding efficiency of the pixel electrode layer itself, whereas it further improves the contrast of the Liquid Crystal Display device. Furthermore it also presents an optical filter for the incident light, as will be explained in a further paragraph of this document.

But since the fourth metal layer serves as the reflective pixel electrode layer, a permanent anti-reflective TiN layer, such as is needed for efficient pattern formation in most submicron lithography when small holes are to be defined in a reflective structure as Al, can not be allowed. To be capable to still define and etch very small openings between the pixel electrodes, first a bottom anti-reflective coating layer is deposited before the actual photoresist is deposited during the lithography step. This is a known procedure which allows to define light transmissive regions 22 as small as 500 nm. During the subsequent etching step only plasma strip is perfomed, in order not to further loose reflectivity on this layer.

After patterning and etching this fourth conductive layer 32, reflective type liquid crystal display device RTLCDD is further processed using conventional well known procedures related to the liquid crystal technology. These are only indicated by means of example and completeness in FIG. 1 and include a first orientation layer, the liquid crystal layer, another orientation layer, a transparant electrode and a protective glass substrate.

The reason why the third conductive layer 30 has to have an absorbing layer on top, in combination with the fourth conductive layer 32 which has this light absorbing layer at the bottom, will now be explained. In a particular embodiment, the insulator between the third and fourth conductive layers has a final thickness which does not exceed 365 nm. This is exactly the lower bound of the wavelength of the incoming light from the projector in the envisaged applications for this particular embodiment. In this case, the light transmissive regions 22 between the reflective pixel electrodes 20 were thereby also not larger than 500 nm, such that again only light with a wavelength smaller than 500 nm can enter this region. The overlap region between pixel electrodes 20 and light shield structures defined in layer 30, thereby serves as a tunnel structure for this incident light. The length of this tunnel structure, indicated by d, is thereby at least 10 times the opening of these light transmissive regions. The filtered incident light will thus undergo multiple reflections in this tunnel structure, but each time, due to the presence of an absorbing layer at both "inner" sides of this tunnel, this light will be gradually absorbed. At the end, when reaching the "gap" in the light shield, the incident light will be completely absorbed due to this layout parameter d.

Other embodiments are possible, whereby other dimensions for the light transmissive regions 22, the thickness of the third intermetal insulator layer, and the overlap d are used, dependent on the spectrum of the light which is to be shielded. The openings 22 between the pixel electrodes are thereby such that they already filter the incoming light, whereas the thickness of the third intermetal insulator layer 31 is smaller than these regions 22 and such that they correspond to a lower boundary of this spectrum. The overlap d thereby is foreseen such that a tunnel region of at least 10 times the opening diameter of the light transmissive regions 22 is obtained.

In the aforementioned particular embodiment, the thickness of the double Ti/TiN sandwich of 160 nm for layer 30 is such that it is 100% light tight for the envisaged application as a reflective light valve for projection television with illumination of 1 Mlux. Indeed, leakage currents of less than 0.5 pA per pixel have been measured at this illumination. The pixel pitch, which is defined by the underlying pixel transistors such as (N−1,M) and (N,M), as well as by the poly—active area storage capacitor also shown on FIG. 1 is thereby typically 15 um, but structures with a pitch up to 13 um have been processed already.

The bottom plate of this storage capacitor thereby consists of a highly doped active area region, which is kept at the substrate potential. The active area contacting region may be shared with other pixel electrode regions, and is not shown in FIG. 1 in order not to overload the drawing.

The discussed processing steps can as well be used for the formation of other conductive layer structures such as metal capacitors. Such a capacitor C is shown in FIG. 2. This capacitor C consists of the parallel connection of a first capacitor C1 defined between the second and third conductive layers, 28 and 30, and a second capacitor C2 defined between the third and fourth conductive layers, 30 and 32, in a four metal layer CMOS process. Although not relevant to the invention, other circuitry processed by the standard CMOS processing steps for making transistors and first metal layers, are shown in FIG. 2 by way of example and completeness.

These capacitors are interesting since this parallel connection can increase the capacitance value of C2 with about 50%, depending on the relative values of the thicknesses of insulator layers 31 and 29. The parallel connection can thereby as well be obtained by means of the direct via between metal4 and metal2. This, as already explained for the reflective type liquid crystal display devices, requires the use of a very thin intermediate metal3 layer. For the capacitor C depicted in FIG. 2 this thin layer can again be realised by using a TiN on top of Ti, whereby a thickness of as small as 80 nm for the total structure can be obtained, by for instance 60 nm TiN on top op 20 nm Ti.

In the case of the capacitor structure of FIG. 2, there is no necessity for having a light absorbing layer underneath a light reflective layer for the formation of the fourth conductive layer. This is also depicted in FIG. 2 whereby the fourth conductive layer 31 in this case consists of a light reflective layer 322, typically aluminium, beneath a light absorbing layer 321 such as TiN. The third conductive,layer is kept very thin since it does not have to function as a light shield. In the embodiment of FIG. 2 layer 30 thereby consists only of one multilayer of a reflective layer 302 beneath a light absorbing layer 301. Because of the more traditional fourth conductive layer for which requirements of reflectivity are not important now, the patterning of this layer can occur without the extra bottom anti reflective layer and more traditional lithography and etching procedures can be applied.

As was the case for the reflective type liquid crystal display devices, the second and third intermetal insulators 29 and 31 have to be thin, and very planar, in order to allow the direct via definition. These can as well consist of the aforementioned PETEOS layers, planarized using chemical mechanical polishing techniques to a thickness on top of metal of maximum 600, resp. 365 nm for the second, resp. third intermetal insulator layers 29 and 31. By these thicknesses an increase in the capacitance of C2 with more than 60% is obtained using a structure C.

It has to be remarked that all dimensions given within this description are of course to be interpreted with the normal tolerances of processing at the time of the invention, being 5%, except for the upper limits of thicknesses defined.

While the principles of the invention have been described above in connection with specific apparatus, it is to be clearly understood that this description is made only by way of example and not as a limitation on the scope of the invention, as defined in the appended claims.

What is claimed is:

1. A method for processing conductive layer structures, comprising:

depositing a first conductive layer, a first intermetal insulator layer, a second conductive layer, a second intermetal insulator layer, a third conductive layer, a third intermetal insulator layer, and a fourth conductive layer, characterized in that said depositing said third conductive layer includes at least one succession of depositing a light-absorbing layer on top of a light-reflective layer, such that a thickness of said third conductive layer does not exceed 350 nm.

2. The method according to claim 1, characterized in that said light-absorbing layer consists of Titanium Nitride and said light-reflective layer consists of Titanium.

3. The method according to claim 1, characterized in that said fourth conductive layer is composed of a light reflective layer on top of a light absorbing layer.

4. The method according to claim 3, characterized in that said light reflective layer of said fourth conductive layer is patterned such that during photolithography, a bottom anti-reflective coating layer underneath a photoresist layer is used.

5. The method according to claim 1, characterized in that said third intermetal insulator layer is planarized to a maximum thickness of 365 nm above said third conductive layer.

6. The method according to claim 5, characterized in that said method further comprises patterning and etching a via hole through the insulator consisting of said third intermetal insulator layer on top of said second intermetal insulator layer.

7. The method according to claim 1, characterized in that said second intermetal insulator layer is further planarized to a maximum thickness of 600 nm above said second conductive layer.

8. A reflective type liquid crystal display device (RTLCDD) including an array of reflective pixel electrodes over a surface of a silicon substrate with light transmissive regions being located between said reflective pixel electrodes, structures defined in a first conductive layer between said reflective pixel electrodes and said surface, structures defined in a second conductive layer between said reflective pixel electrodes and said surface, and light shield structures defined in a third conductive layer between said reflective pixel electrodes and said surface, for preventing light entering at active circuitry located within said silicon substrate, said reflective pixel electrodes being formed in a fourth conductive layer, characterized in that said third conductive layer is composed of at least one multilayer consisting of a light absorbing material on top of a light reflective material, such that a total thickness of said third conductive layer does not exceed 350 nanometers.

9. The reflective type liquid crystal display device (RTLCDD) according to claim 8, characterised in that said at least one multilayer consists of a Titanium Nitride layer on top of a Titanium layer.

10. The reflective type liquid crystal display device (RTLCDD) according to claim 8, characterised in that a third intermetal insulator layer between said third conductive layer and said fourth conductive layer has a thickness smaller than the dimensions of said light transmissive regions between said pixel electrodes, whereby said fourth conductive layer is composed of a light reflective layer on top of a light absorbing layer.

11. The reflective type liquid crystal display device (RTLCDD) according to claim 10, characterised in that said thickness of said third intermetal insulator layer does not exceed 365 nm.

12. The reflective type liquid crystal display device (RTLCDD) according to claim 11, characterised in that said pixel electrodes are connected to said structures in said second conductive layer by means of a direct via hole filled with a conductive material between said fourth conductive layer and said second conductive layer.

13. The reflective type liquid crystal display device (RTLCDD) according to claim 10, characterised in that said dimensions of said light transmissive regions between said pixel electrodes do not exceed 500 nm.

14. The reflective type liquid crystal display device (RTLCDD) according to claim 10, characterised in that a length of an overlap region of one of said pixel electrodes and one of said reflective light shield structures is at least the tenfold of a length of one of said light transmissive regions.

15. The reflective type liquid crystal display device (RTLCDD) according to claim 8, characterised in that a second intermetal insulator layer between said second conductive layer and said third conductive layer has a maximum thickness of 600 nm.

16. A metal capacitor structure (C) formed in a four-metal layer CMOS process wherein a first conductive layer, a second conductive layer, a third conductive layer, and a fourth conductive layer are present, in between which a first intermetal insulator layer, a second intermetal insulator layer and a third intermetal insulator layer are present, said metal capacitor structure (C) including a parallel connection of a first capacitor formed between said second conductive layer of said CMOS process and said third conductive layer of said CMOS process, and a second capacitor formed between said third conductive layer and said fourth conductive layer of said CMOS process, characterized in that said third conductive layer is composed of at least one multilayer consisting of a light absorbing material on top of a light reflective material, such that the total thickness of said third conductive layer does not exceed 350 nanometers.

17. The metal capacitor structure (C) according to claim 16, characterised in that said at least one multilayer consists of a Titanium Nitride layer on top of a Titanium layer.

18. The metal capacitor structure (C) according to claim 16, characterised in that a thickness of said second intermetal insulator layer between said second conductive layer and said third conductive layer does not exceed 600 nm, whereas a thickness of said third intermetal insulator layer between said third conductive layer and said fourth conductive layer does not exceed 365 nm.

19. The metal capacitor structure (C) according to claim 18, characterised in that said parallel connection of said first capacitor and said second capacitor is obtained by one via hole filled with a conductive material between said second conductive layer and said fourth conductive layer.

* * * * *